United States Patent
Bao et al.

(10) Patent No.: US 10,249,543 B2
(45) Date of Patent: Apr. 2, 2019

(54) FIELD EFFECT TRANSISTOR STACK WITH TUNABLE WORK FUNCTION

(71) Applicant: International Business Machines Corporation, Armonk, NY (US)

(72) Inventors: Ruqiang Bao, Niskayuna, NY (US); Siddarth A. Krishnan, Newark, NY (US); Unoh Kwon, Fishkill, NY (US); Vijay Narayanan, New York, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/795,413

(22) Filed: Oct. 27, 2017

(65) Prior Publication Data
US 2018/0047639 A1 Feb. 15, 2018

Related U.S. Application Data

(62) Division of application No. 14/996,572, filed on Jan. 15, 2016, now Pat. No. 9,859,169.

(51) Int. Cl.
| | |
|---|---|
| H01L 21/28 | (2006.01) |
| H01L 29/49 | (2006.01) |
| H01L 29/51 | (2006.01) |
| H01L 29/66 | (2006.01) |
| H01L 27/092 | (2006.01) |
| H01L 21/8238 | (2006.01) |

(52) U.S. Cl.
CPC ........... *H01L 21/823842* (2013.01); *H01L 21/28088* (2013.01); *H01L 21/823821* (2013.01); *H01L 27/092* (2013.01); *H01L 27/0924* (2013.01); *H01L 29/4966* (2013.01); *H01L 29/517* (2013.01); *H01L 29/66545* (2013.01); *H01L 21/28185* (2013.01); *H01L 21/28194* (2013.01)

(58) Field of Classification Search
None
See application file for complete search history.

(56) References Cited

U.S. PATENT DOCUMENTS

| | | | | |
|---|---|---|---|---|
| 2014/0054717 | A1* | 2/2014 | Edge | ............... H01L 21/28088 257/369 |
| 2017/0207131 | A1 | 7/2017 | Bao et al. | |

OTHER PUBLICATIONS

List of IBM Patents or Patent Applications Treated as Related (Appendix P); Filed Oct. 27, 2017, 2 pages.
Ruqiang Bao, et al. "Field Effect Transistor Stack With Tunable Work Function," U.S. Appl. No. 15/795,414, filed Oct. 27, 2017.

* cited by examiner

*Primary Examiner* — Erik Kielin
(74) *Attorney, Agent, or Firm* — Cantor Colburn LLP; Steven Myers

(57) ABSTRACT

A method for fabricating a gate stack of a semiconductor device comprises forming a first dielectric layer over a channel region of the device, forming a first nitride layer over the first dielectric layer, forming a first gate metal layer over the first nitride layer, forming a capping layer over the first gate metal layer, removing portions of the capping layer and the first gate metal layer to expose a portion of the first nitride layer in a p-type field effect transistor (pFET) region of the gate stack, depositing a scavenging layer on the first nitride layer and the capping layer, depositing a second nitride layer on the scavenging layer, and depositing a gate electrode material on the second nitride layer.

7 Claims, 15 Drawing Sheets

FIELD EFFECT TRANSISTOR STACK WITH TUNABLE WORK FUNCTION

DOMESTIC AND/OR FOREIGN PRIORITY

This application is a divisional of U.S. application Ser. No. 14/996,572, titled "FIELD EFFECT TRANSISTOR STACK WITH TUNABLE WORK FUNCTION" filed Jan. 15, 2016, the entire contents of which are incorporated herein by reference.

BACKGROUND

The present invention generally relates to semiconductor devices, and more specifically, to metal-oxide-semiconductor field effect transistor (MOSFET) gates.

The MOSFET is a transistor used for amplifying or switching electronic signals. The MOSFET has a source, a drain, and a metal oxide gate electrode. The metal gate is electrically insulated from the main semiconductor n-channel or p-channel by a thin layer of insulating material, for example, silicon dioxide or glass, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET uses electrons as the current carriers and with n-doped source and drain junctions. The pFET uses holes as the current carriers and with p-doped source and drain junctions.

SUMMARY

According to an embodiment of the present invention, a method for fabricating a gate stack of a semiconductor device comprises forming a first dielectric layer over a channel region of the device, forming a first nitride layer over the first dielectric layer, forming a first gate metal layer over the first nitride layer, forming a capping layer over the first gate metal layer, removing portions of the capping layer and the first gate metal layer to expose a portion of the first nitride layer in a p-type field effect transistor (pFET) region of the gate stack, depositing a scavenging layer on the first nitride layer and the capping layer, depositing a second nitride layer on the scavenging layer, and depositing a gate electrode material on the second nitride layer.

According to another embodiment of the present invention, a semiconductor device comprising a gate stack arranged over a channel region of the device, the gate stack comprising an n-type field effect transistor (nFET) portion comprises a dielectric layer arranged on a substrate, a first nitride layer arranged on the dielectric layer, a first gate metal layer arranged on the first nitride layer, a capping layer arranged on the first gate metal layer, a scavenging layer arranged on the capping layer, a second nitride layer arranged on the scavenging layer, and a gate electrode arranged on the second nitride layer.

According to yet another embodiment of the present invention, a semiconductor device comprises a gate stack arranged over a channel region of the device, the gate stack comprising an n-type field effect transistor (nFET) portion comprising a dielectric layer arranged on a substrate, a first nitride layer arranged on the dielectric layer, a first gate metal layer arranged on the first nitride layer, a capping layer arranged on the first gate metal layer, a scavenging layer arranged on the capping layer, a second nitride layer arranged on the scavenging layer, and a gate electrode arranged on the second nitride layer, and p-type field effect transistor (pFET) portion comprising the dielectric layer arranged on the substrate, the first nitride layer arranged on the dielectric layer, the scavenging layer arranged on the first nitride layer, the second nitride layer arranged on the scavenging layer, and the gate electrode arranged on the second nitride layer.

BRIEF DESCRIPTION OF THE DRAWINGS

FIG. 1 illustrates a top view of a substrate with semiconductor fins and arranged on the substrate.

FIG. 2 illustrates a cutaway view along the line A-A of FIG. 1 of the fins and and the substrate.

FIG. 3 illustrates a cut-away view along the width of the gate stack (longitudinal direction).

FIG. 4 illustrates a barrier layer is deposited over the oxide layer.

FIG. 5 illustrates the resultant structure following the deposition of a layer of nFET gate metal.

FIG. 6 illustrates the resultant structure following the formation of a cap layer that may include, for example, a nitride material such as TiN.

FIG. 7 illustrates the resultant structure following a patterning and etching process that removes portions of the barrier layer, the gate metal and the cap layer.

FIG. 8 illustrates the formation of a nitride layer.

FIG. 9 illustrates the deposition of a scavenging layer.

FIG. 10 illustrates the resultant structure following the deposition of a PWF layer.

FIG. 11 illustrates the resultant structure following the deposition of gate electrode over exposed portions of the PWF layer.

FIG. 12 shows the formation gate stack having an nFET portion and a pFET portion.

FIG. 13 illustrates the resultant structure following a lithographic patterning and etching process FIG. 14 illustrates the deposition of a scavenging layer.

FIG. 15 illustrates the resultant structure following the deposition of a PWF layer.

FIG. 16 shows the formation of a gate stack having an nFET portion and a pFET portion.

FIG. 17 illustrates the resultant structure following a lithographic patterning and etching process.

FIG. 18 illustrates the deposition of a barrier layer that is deposited over the oxide layer.

FIG. 19 shows the deposition of a gate metal over the barrier layer in the nFET portion and the pFET portion.

FIG. 20 illustrates the resultant structure following the deposition of a PWF layer over the gate metal layer.

FIG. 21 shows the formation of a gate stack having an nFET portion and a pFET portion.

FIG. 22 illustrates the resultant structure following a lithographic patterning and etching process that removes exposed portions of the capping layer and the scavenging layer.

FIG. 23 illustrates the resultant structure following the deposition of a gate metal layer FIG. 24 illustrates the resultant structure following the deposition of a PWF layer over the gate metal layer.

DETAILED DESCRIPTION

Figure 1:
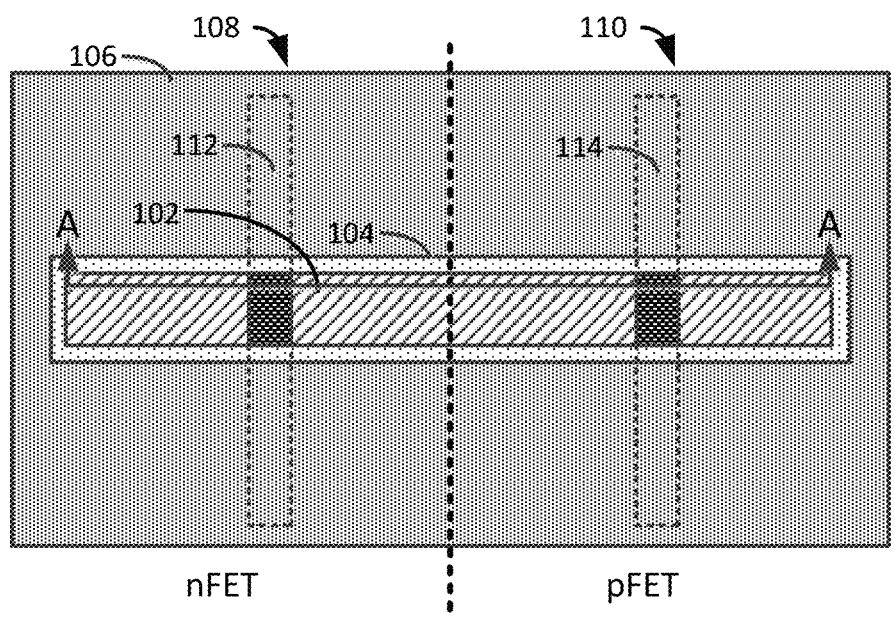
FIGS. 1-11 illustrate an exemplary method for forming a gate stack of an exemplary FET device.

The methods and embodiments described herein provide a robust tunable nFET gate stack in a MOSFET device. In FET devices, metal nitrides such as, for example, TiN and TaN provide a good work function material in the gate stacks to achieve a desired threshold voltage (Vt) in pFET devices. As the scaling of FET devices continues to decrease, multi-gate devices such as finFETs are used to achieve performance goals. Atomic layer deposition (ALD) is used to deposit a uniform layer of the work function metal to reduce Vt variation and control the Vt of the FET devices. Changing the characteristics of work function metals in a replacement metal gate fabrication process using ALD has become more challenging.

Through experimentation, it has been found that the pVt has become less stable and the Vt has become difficult to control when untreated TiN or TaN is used as the work function metal of pFET devices because the response of oxygen vacancy in high-k dielectric materials with respect to the thermal budget in the replacement metal gate fabrication process.

The performance and reliability of nFET devices may be improved using a $D_2$ or high pressure annealing process. However, the process may lead to unstable pVt when the pFET includes a conventional work function metal such as, for example, TiN.

The methods and embodiments described herein provide for a gate stack with a relatively weak oxygen-scavenge stack to define and adjust the pVt as opposed to a single metal nitride layer such as, for example, TiN and TaN. The weak oxygen-scavenge stack may be formed by deposition or integration, and may include, for example, a barrier layer such as, TiN or TaN and a strong oxygen-scavenge material such as TiAlC, TiAl, Al, Ti, NbAl, and TaAlC.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

As used herein, the term "about" modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements may also be present. In contrast, when an element is referred to as being "directly on" or "directly over" another element, there are no intervening elements present, and the element is in contact with another element.

It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIGS. 1-11 illustrate an exemplary method for forming a gate stack of an exemplary FET device.

FIG. 1 illustrates a top view of a substrate 102 with semiconductor fins 112 and 114 arranged on the substrate 102. In the illustrated embodiment, channel regions of the fins 112 and 114 have been exposed following the removal of a sacrificial gate stack (not shown), which was previously patterned on the substrate 102 and the fins 112 and 114. A spacer material 104 is formed around the sacrificial gate stack. An insulator material such as, for example, an oxide or other dielectric material is formed around the spacer material 104. In the illustrated embodiment, the fins 112 will partially define the channel region and source/drain regions of the completed device. The fins 112 will partially define an nFET device, while the fin 114 will partially define a pFET device. The gate stack (described below) is divided into two portions an nFET portion 108 and a pFET portion 110. Non-limiting examples of suitable fin materials include Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

In the illustrated embodiment, the fins 112 and 114 are arranged on the substrate 102 that includes an insulator layer such that a semiconductor on insulator (SOI) substrate may be used. Alternate exemplary embodiments may form fins on a bulk semiconductor substrate.

Figure 2:
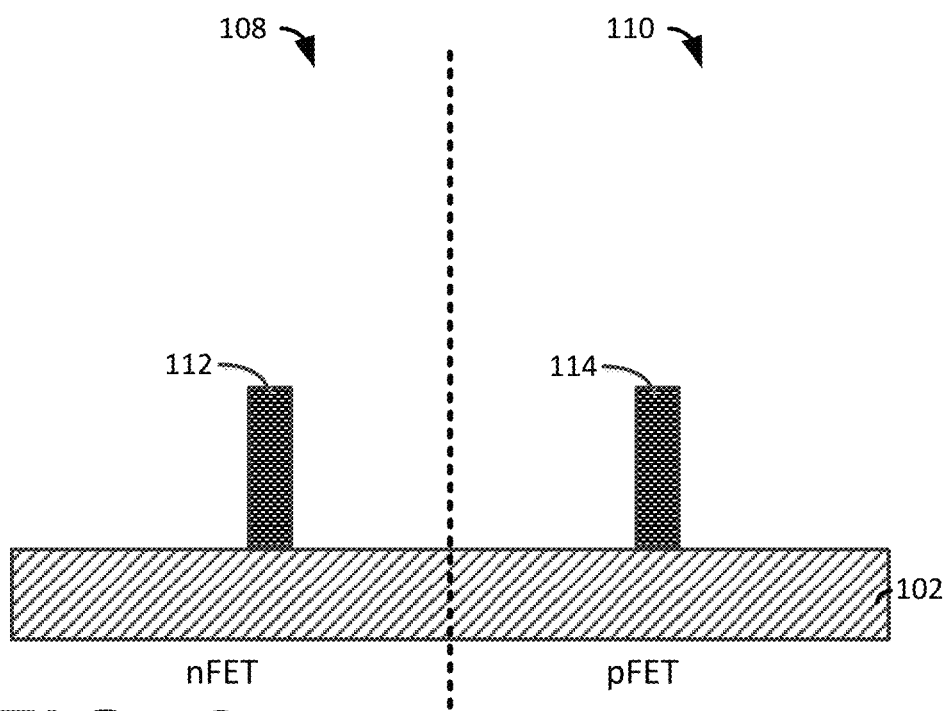

FIG. 2 illustrates a cutaway view along the line A-A of FIG. 1 of the fins 112 and 114 and the substrate 102.

Figure 3:
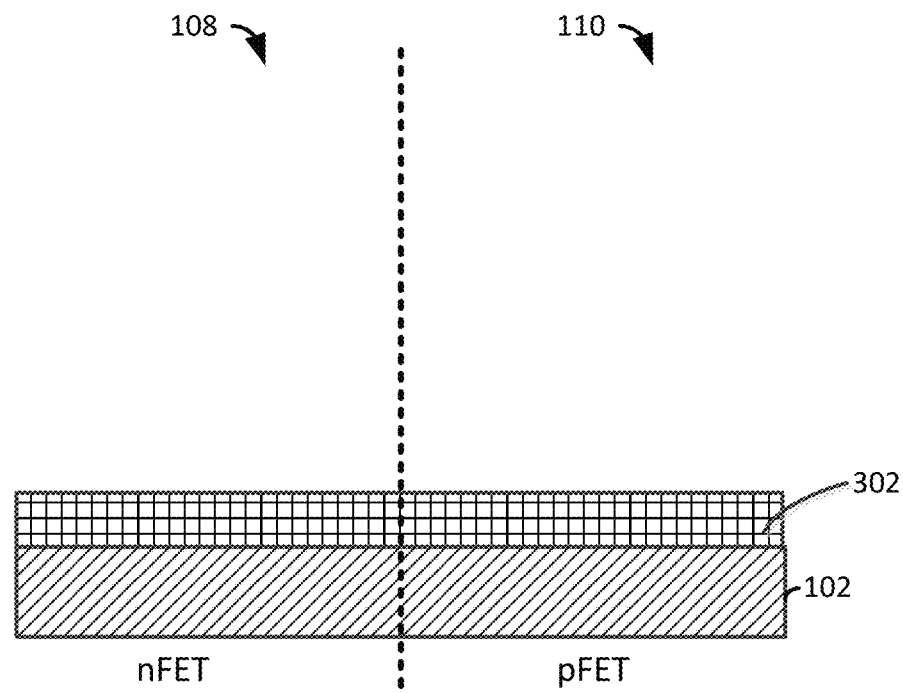

FIG. 3 illustrates a cut-away view along the width of the gate stack (longitudinal direction) through and parallel to the gate. For simplicity, the fins 112 and 114 have been removed from the figures to better illustrate the formation of the exemplary gate stacks. In finFET device fabrication, the layers of the gate stack are arranged conformably over the channel regions of the fins 112 and 114. The embodiments described herein are not limited to finFET devices or other multi-gate devices, and may be used to fabricate, for example, planar FET devices, nanowire devices, tunneling devices, and so on. In such a fabrication scheme for planar FET devices, the substrate 102 would include a semiconductor material, and the gate stacks would be formed in a similar manner on the substrate 102.

In FIG. 3 an oxide (dielectric) layer 302 that may include, for example $SiO_2$ or $HfO_2$ is deposited over the channel region of the device and on portions of the substrate and annealed to begin forming the replacement metal gate. The oxide layer 302 has a thickness of from 10 to 100 angstroms. The oxide layer 302 may be deposited by, for example, a high aspect ratio plasma (HARP), a high temperature oxide (HTO), a high density plasma (HDP), or an atomic layer deposition (ALD) process, or any combination thereof. The dielectric layer 302 and subsequent layers described herein is formed over the channel region conform not only over the fins 112 (described above) but also conform over the sidewalls of the 104 (of FIG. 1). Likewise, layers formed subsequently conform to the profile of the previous layers.

In the exemplary method, the nFET stack is formed prior to forming the pFET stack. The nFET stack includes a strong oxygen-scavenge stack, while the subsequently formed pFET stack includes a weak oxygen-scavenge stack.

One difference between nFET strong oxygen-scavenge stack and the pFET if a single metal layer is used is that the enthalpy change to form metal oxide is much higher for nFET than that for pFET. For example, Al is used for nFET and Ni is used for pFET. In another hand, the oxygen-scavenge stack can be formed by same materials and the same structure but with different film thickness or different film composition. For example, TiN/TiAl/TiN stack is used as oxygen-scavenge stack. If the layers are similar except for the TiAl thickness, thicker TiAl will form stronger oxygen-scavenge stack, but thinner TiAl will form the weak oxygen-scavenge stack. Another hand, if the TiAl thickness and top TiN thickness are same, the bottom TiN difference can also form stronger oxygen-scavenge stack by using thinner bottom TiN and weeker oxygen-scavenge stack by using thicker bottom TiN.

Figure 4:
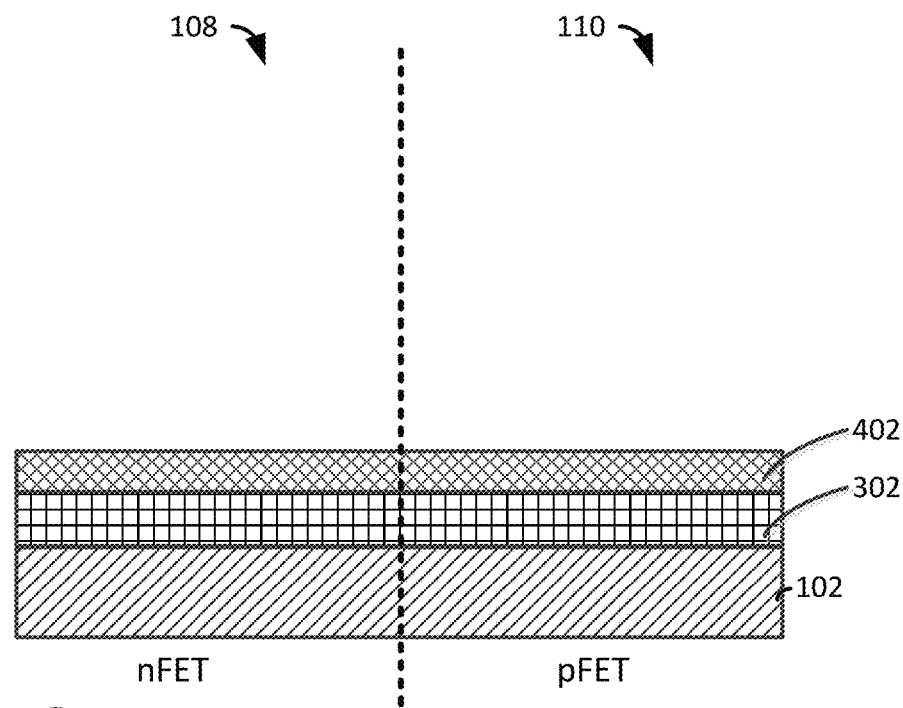

Referring to FIG. 4 a barrier layer 402 is deposited over the oxide layer 302. The barrier layer 402 may include metal nitrides and metal carbides, for example, TiN, TaN, TiC, TaC, and be formed by, for example, an atomic layer deposition process.

Figure 5:
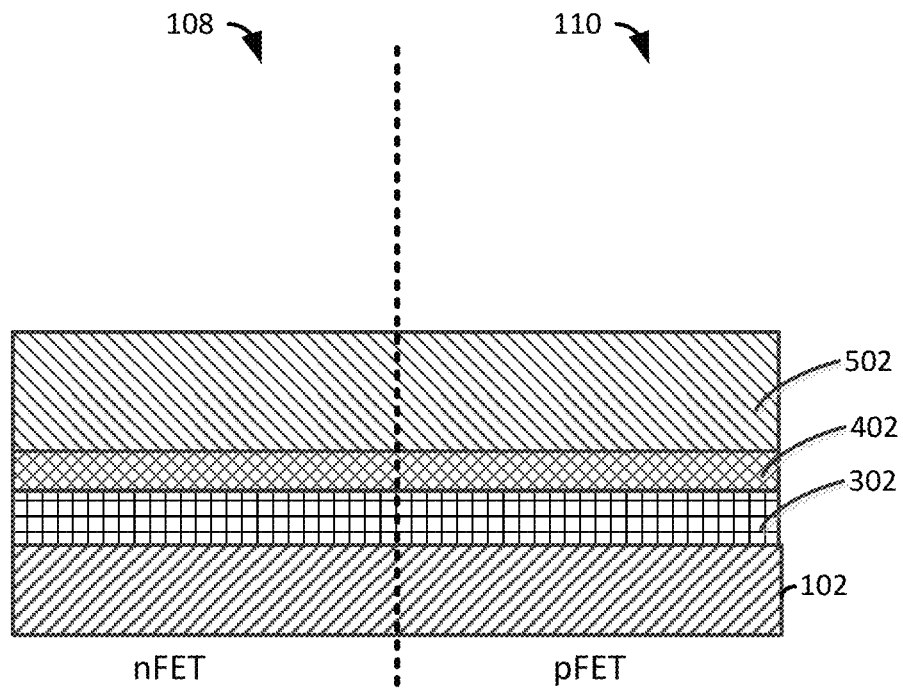

FIG. 5 illustrates the resultant structure following the deposition of a layer of nFET gate metal 502 such as, for example, TiAlC or TiAl, Ti, Al, NbAlC, over the barrier layer 402, using for example, an ALD process.

Figure 6:
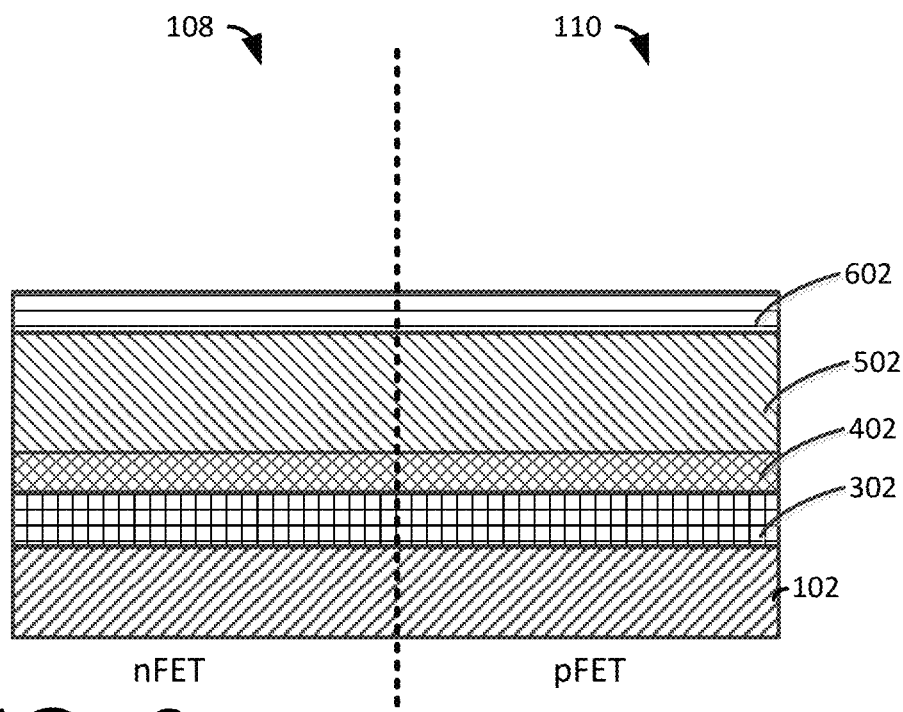

FIG. 6 illustrates the resultant structure following the formation of a cap layer 602 that may include, for example, a nitride material such as TiN.

Figure 7:
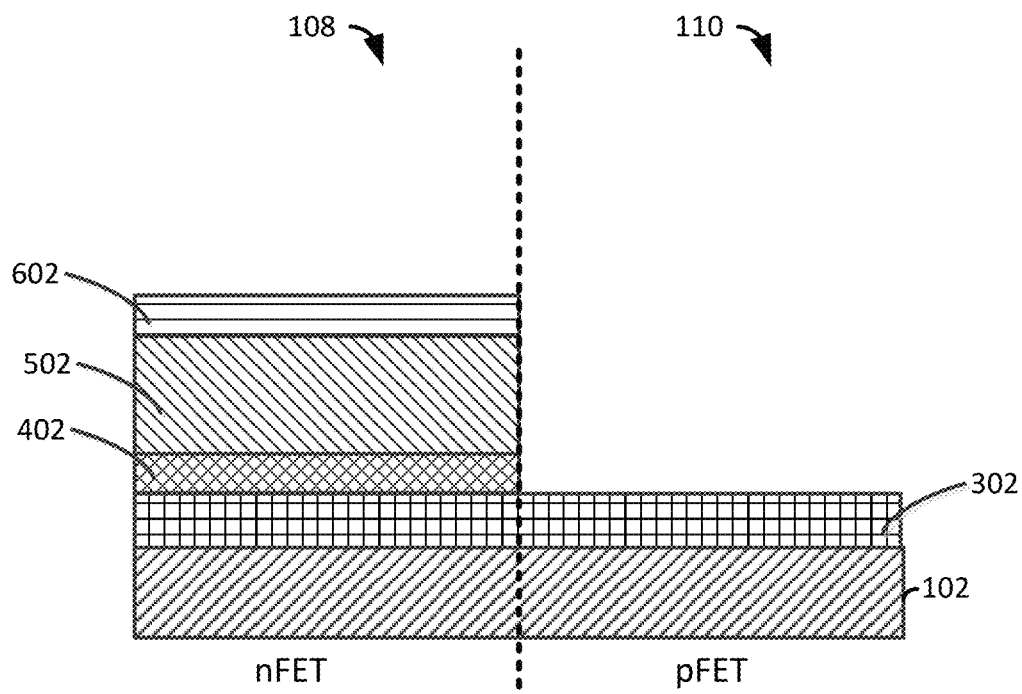

FIG. 7 illustrates the resultant structure following a patterning and etching process that removes portions of the barrier layer 402, the gate metal 502 and the cap layer 602 from the pFET portion 110 of the gate stack. The etching process may include any suitable etching process or combination of processes such as, for example, reactive ion etching, which exposes a portion of the oxide layer 302.

Figure 8:
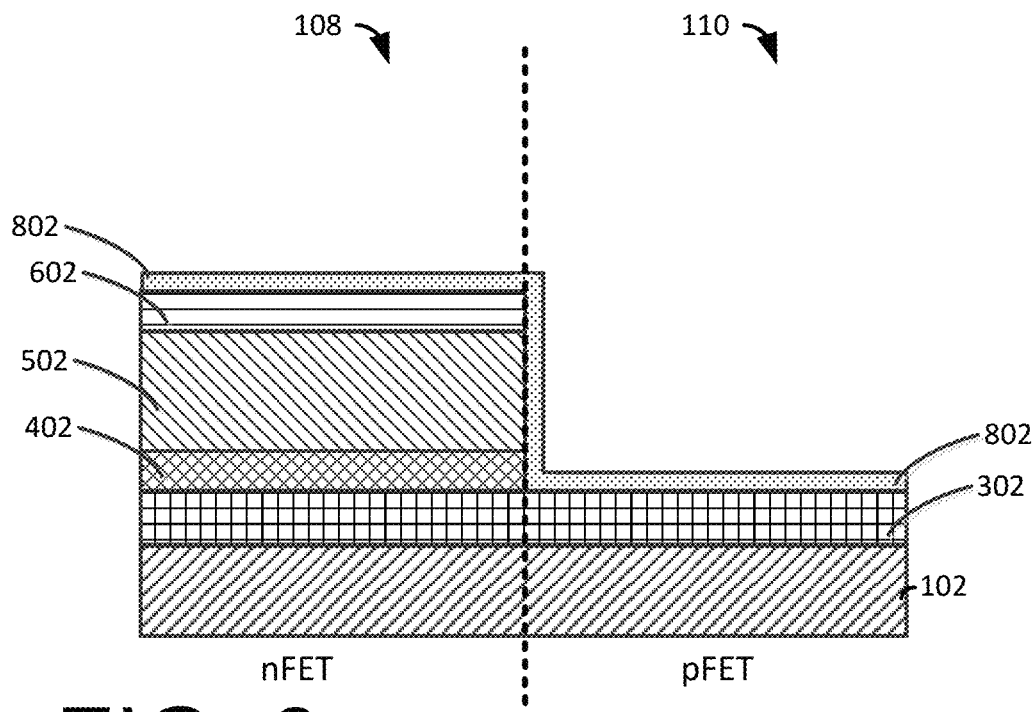

FIG. 8 illustrates the formation of a nitride layer 802 using for example an ALD process that deposits the nitride layer 802 on the exposed portions of the oxide layer 302 and on the cap layer 602. The nitride layer 802 may include, for example, TiN or TaN.

Figure 9:
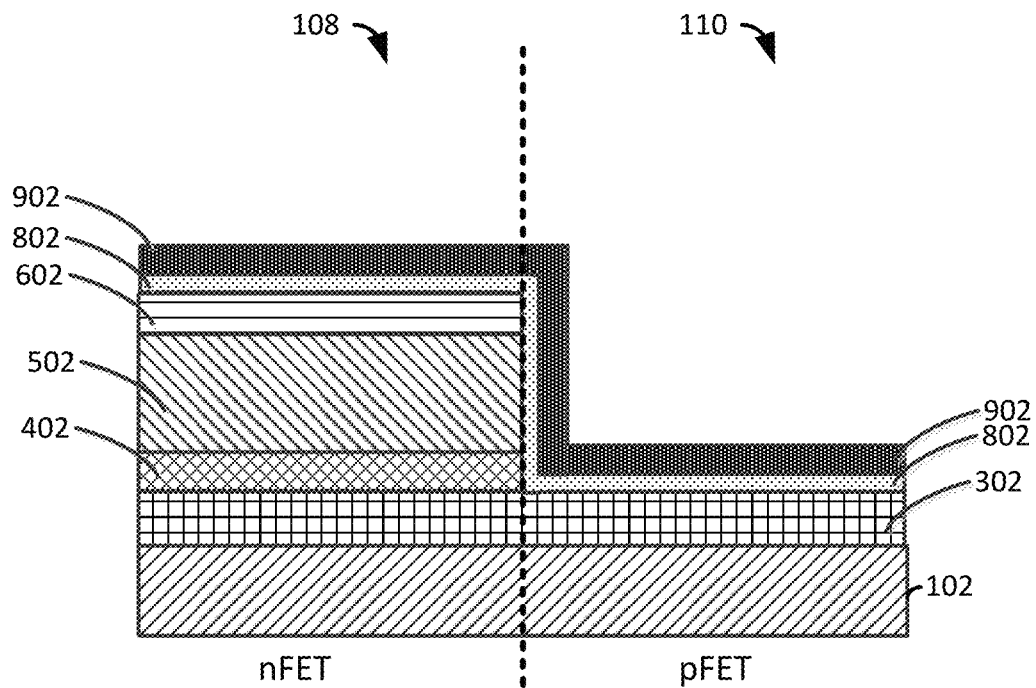

FIG. 9 illustrates the deposition of a scavenging layer 902 that may include, for example, TiAlC or TiAl, Ti, Al, TiAlC, NbAlC over the nitride layer 802. The scavenging layer 902 and the nitride layer 802 define a weak oxygen-scavenge stack.

Figure 10:
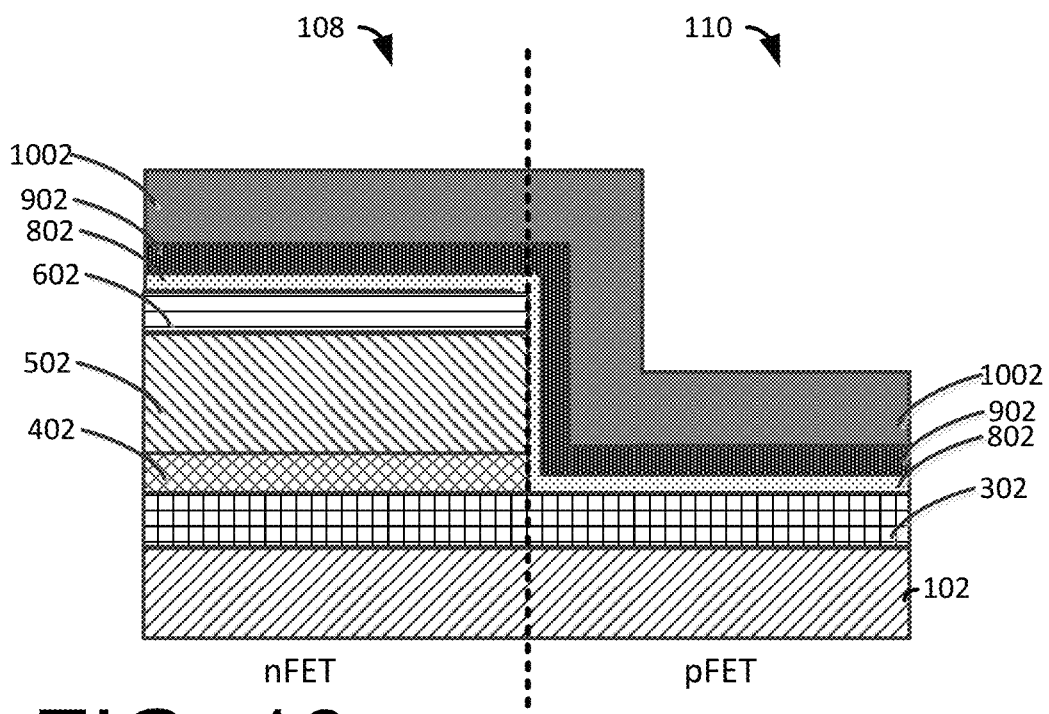

FIG. 10 illustrates the resultant structure following the deposition of a pFET work function (PWF) metal layer 1002 over the scavenging layer 902. The PWF layer 1002 includes, for example, a TiN or TaN material that may be formed by, for example, an atomic layer deposition process.

Figure 11:
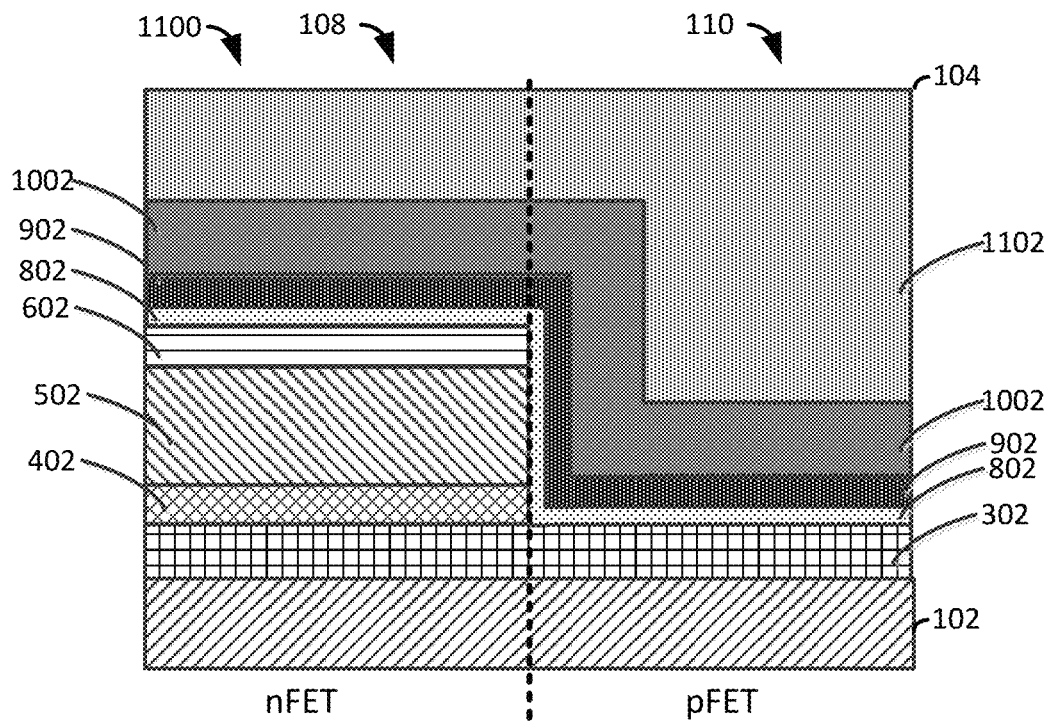

FIG. 11 illustrates the resultant structure following the deposition of gate electrode 1102 over exposed portions of the PWF layer 1002. The gate electrode 1102 may include, for example, tungsten that is formed using a relatively cool filling deposition process followed by a planarizing process such as, chemical mechanical polishing (CMP).

FIG. 11 illustrates an exemplary embodiment of a gate stack 1100 that includes an nFET portion 108 and a pFET portion 110.

FIGS. 12-15 illustrate another exemplary method for forming an alternate embodiment of a gate stack.

Figure 12:
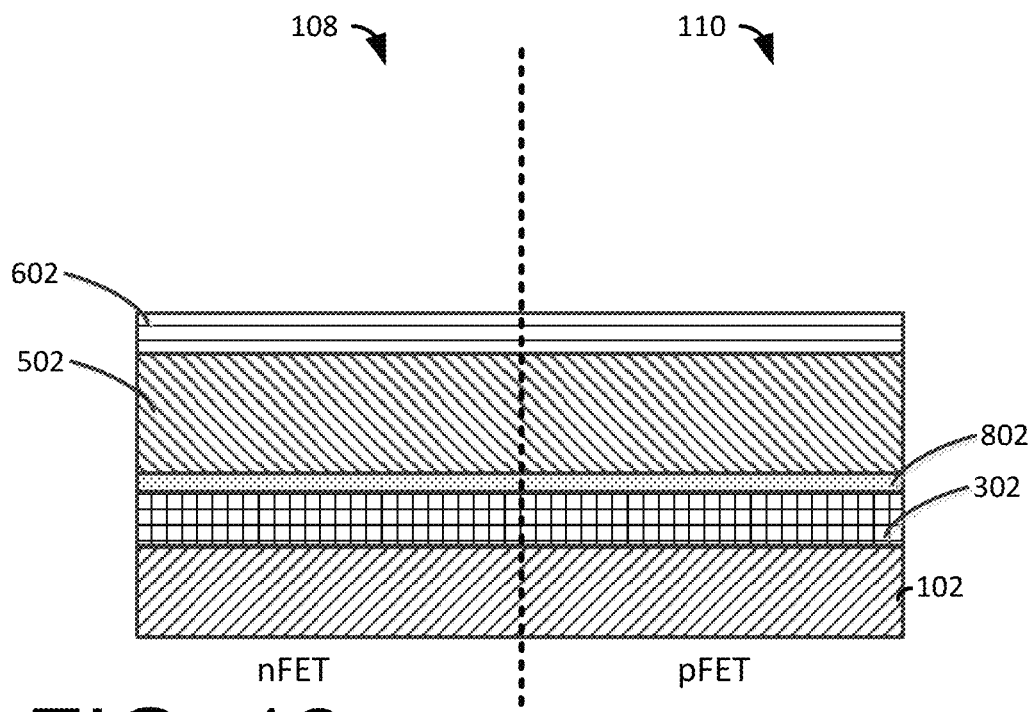
FIGS. 12-15 illustrate another exemplary method for forming an alternate embodiment of a gate stack.

FIG. 12 shows the formation gate stack having an nFET portion 108 and a pFET portion 110. The fabrication of the gate stack begins with the deposition of an oxide (dielectric) layer 302 on the substrate or fin, a nitride layer 802 is disposed on the oxide layer 302. A layer of nFET gate metal 502 such as, for example, TiAlC or TiAl, Ti, Al, TiAlC, NbAlC is deposited over the nitride layer 802, and a capping layer 602 that may include, for example, TiN is deposited over the gate metal 502.

Figure 13:
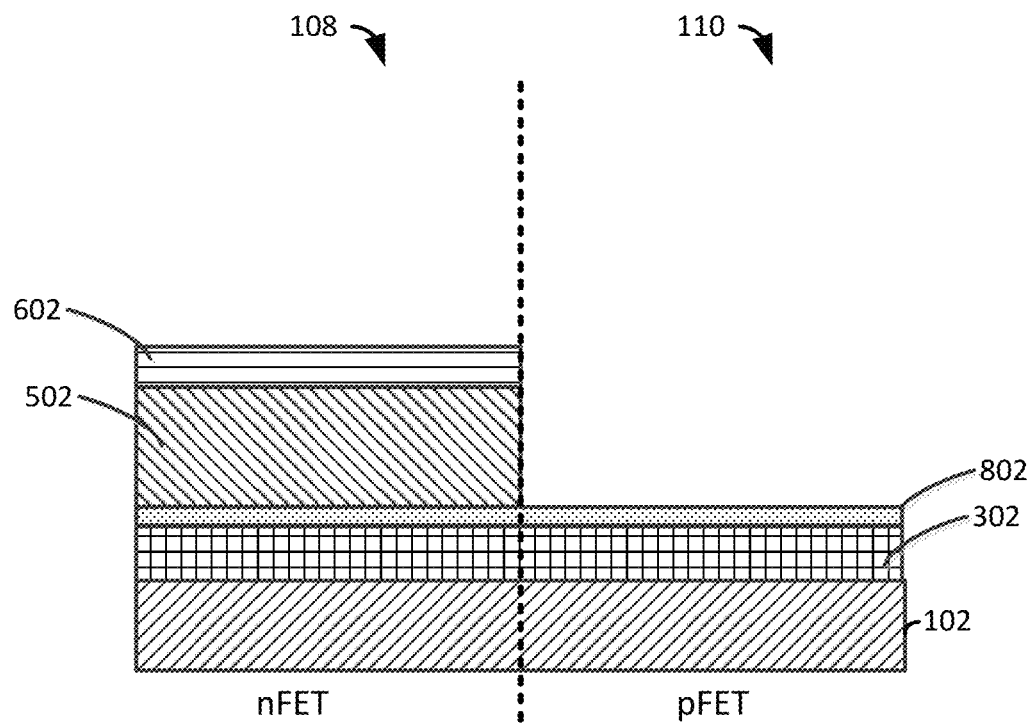

FIG. 13 illustrates the resultant structure following a lithographic patterning and etching process such as, for example, reactive ion etching that removes exposed portions of the capping layer 602 and the gate metal 502 from the pFET portion 110 to expose the nitride layer 802 in the pFET portion 110.

Figure 14:
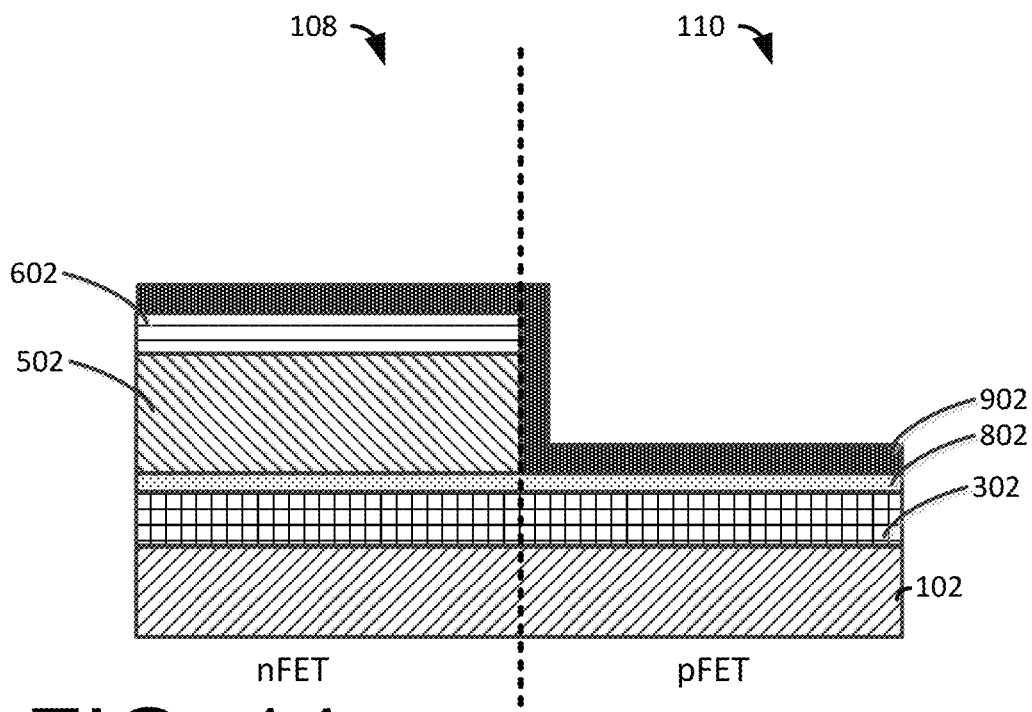

FIG. 14 illustrates the deposition of a scavenging layer 902 that may include, for example, TiAlC or TiAl, Ti, Al, TiAlC, NbAlC over the nitride layer 802 in the pFET portion and over the capping layer 602 in the nFET portion 108.

Figure 15:
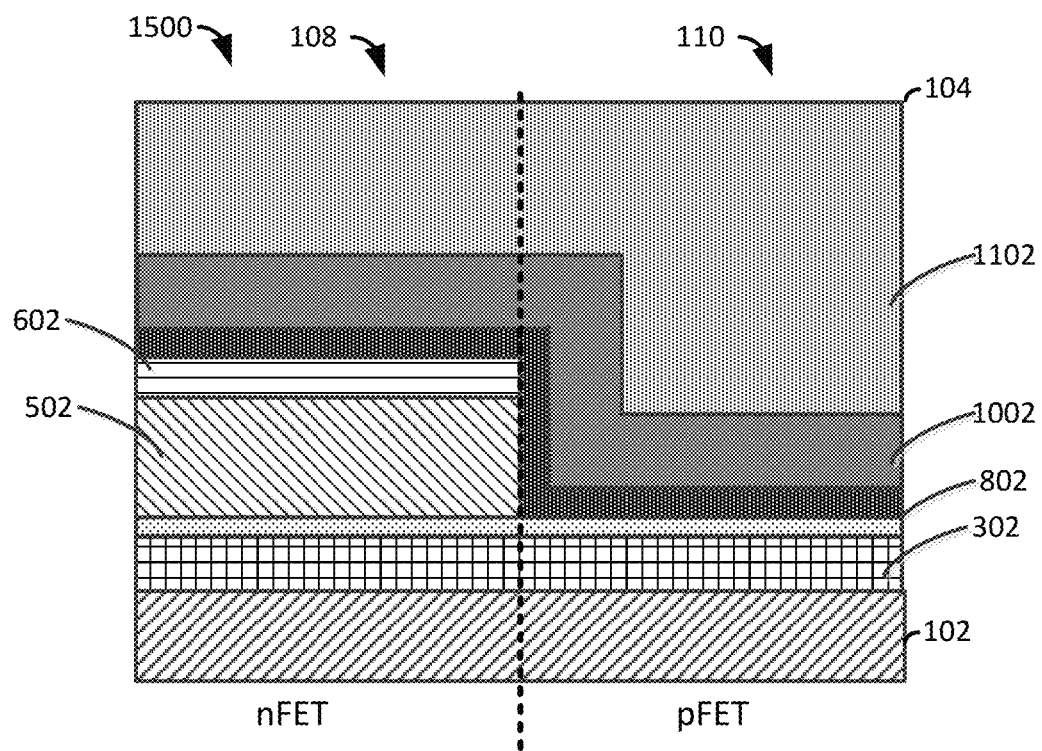

FIG. 15 illustrates the resultant structure following the deposition of a PWF layer 1002 over the scavenging layer 902. After the PWF layer 1002 is deposited, the gate electrode 1102 is formed over the PWF layer 1002 in a similar manner as described above and planarized using a suitable planarization process, such as, for example, chemical mechanical polishing.

FIG. 15 illustrates an exemplary embodiment of a gate stack 1500 that includes an nFET portion 108 and a pFET portion 110.

FIGS. 16-20 illustrate another exemplary method for forming another alternate embodiment of a gate stack.

Figure 16:
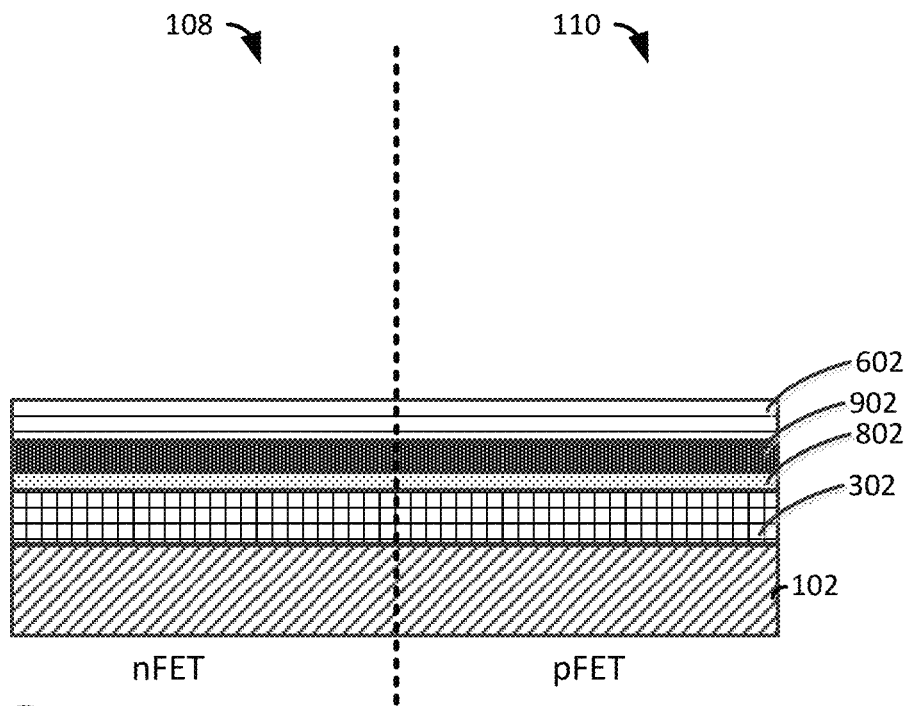
FIGS. 16-20 illustrate another exemplary method for forming another alternate embodiment of a gate stack.

FIG. 16 shows the formation of a gate stack having an nFET portion 108 and a pFET portion 110. The fabrication of the exemplary gate stack begins with the deposition of an oxide (dielectric) layer 302 on the substrate or fin, a nitride layer 802 is disposed on the oxide layer 302. A scavenging layer 902 that may include, for example, TiAlC or TiAl, Ti, Al, TiAlC, NbAlC is disposed over the nitride layer 802. A capping layer 602 that may include, for example, TiN is deposited over the scavenging layer 902.

Figure 17:
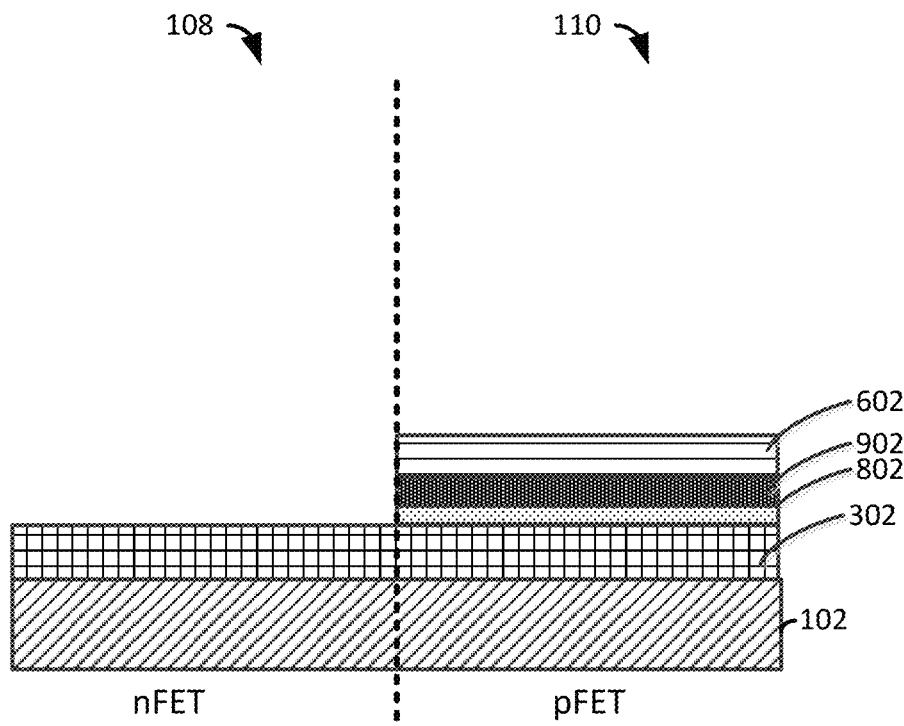

FIG. 17 illustrates the resultant structure following a lithographic patterning and etching process that removes exposed portions of the capping layer 602, the scavenging layer 902, and the nitride layer 802 from the nFET portion 108 of the gate stack, which exposes a portion of the oxide layer 302 in the nFET portion 108.

Figure 18:
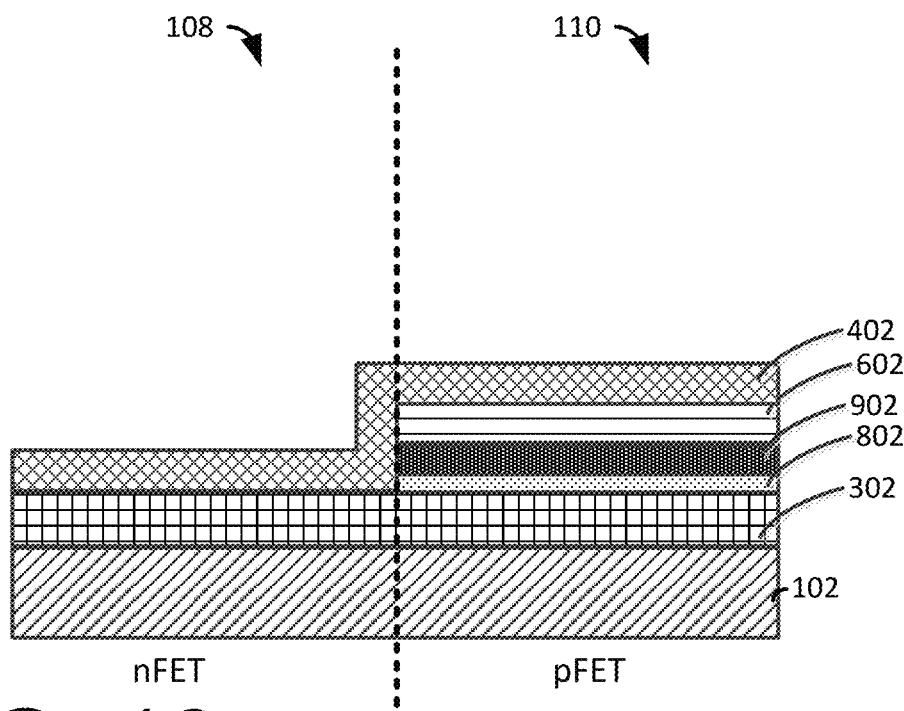

FIG. 18 illustrates the deposition of a barrier layer 402 that is deposited over the oxide layer 302 in the nFET portion 108 and the capping layer 602 in the pFET region 110.

Figure 19:
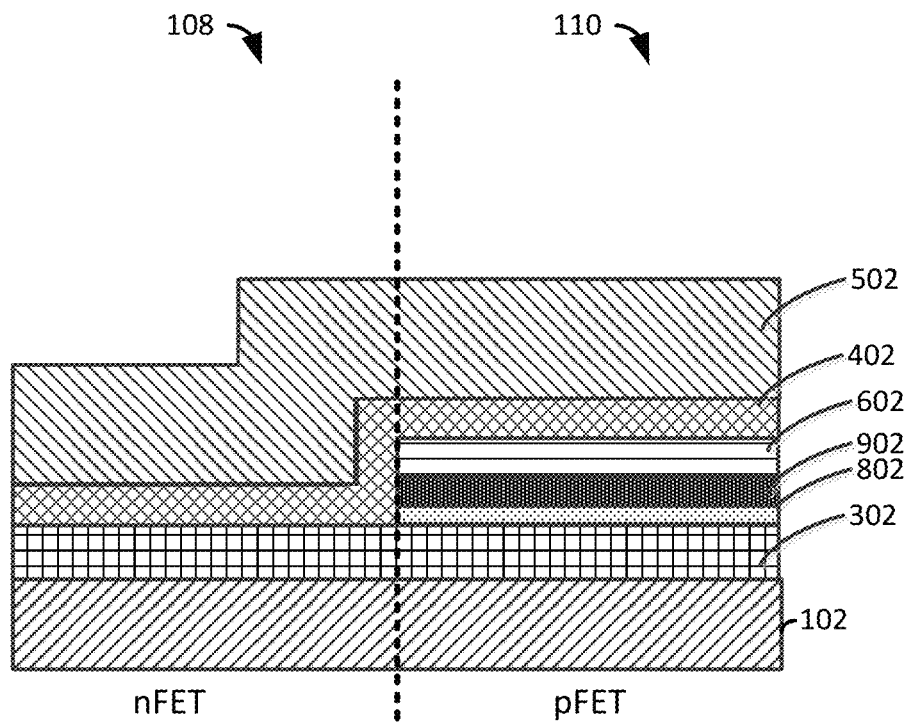

FIG. 19 shows the deposition of a gate metal 502 over the barrier layer 402 in the nFET portion 108 and the pFET portion 110.

Figure 20:
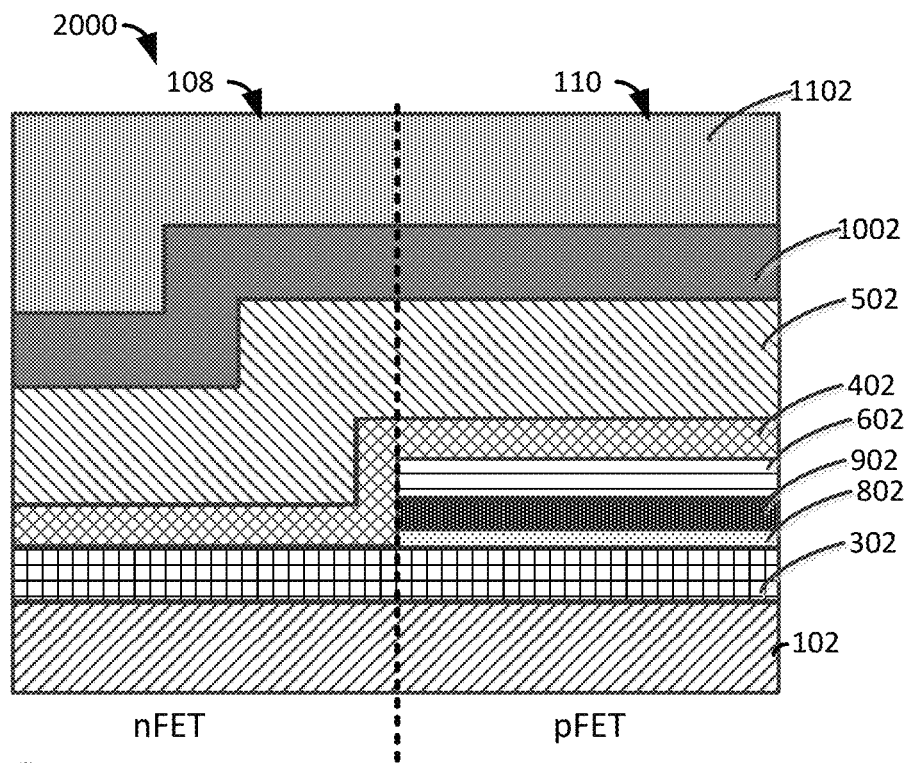

FIG. 20 illustrates the resultant structure following the deposition of a PWF layer 1002 over the gate metal layer 502. Following the formation of the PWF layer 1002, the gate electrode 1102 is formed over the PWF layer 1002 in a similar manner as described above and planarized using a suitable planarization process, such as, for example, chemical mechanical polishing.

FIG. 20 illustrates another alternate exemplary embodiment of a gate stack 2000 that includes an nFET portion 108 and a pFET portion 110.

FIGS. 21-24 illustrate another exemplary method for forming another alternate embodiment of a gate stack.

Figure 21:
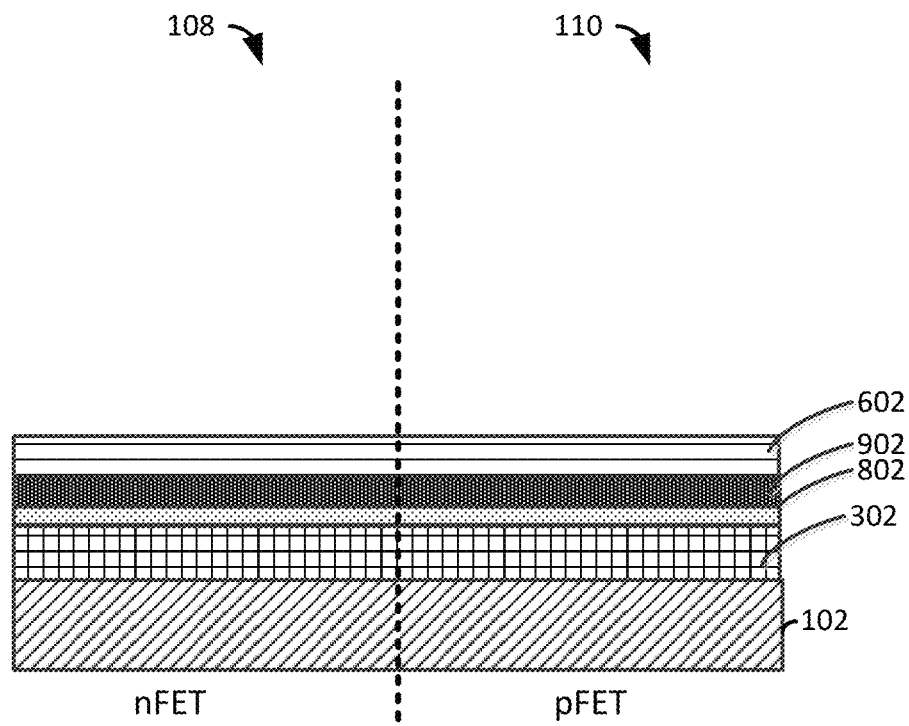
FIGS. 21-24 illustrate another exemplary method for forming another alternate embodiment of a gate stack.

FIG. 21 is similar to FIG. 16 described above, and shows the formation of a gate stack having an nFET portion 108 and a pFET portion 110. The fabrication of the exemplary gate stack begins with the deposition of an oxide (dielectric) layer 302 on the substrate or fin, a nitride layer 802 is disposed on the oxide layer 302. A scavenging layer 902 that may include, for example, TiAlC or TiAl, Ti, Al, TiAlC, NbAlC is disposed over the nitride layer 802. A capping layer 602 that may include, for example, TiN is deposited over the scavenging layer 902.

Figure 22:
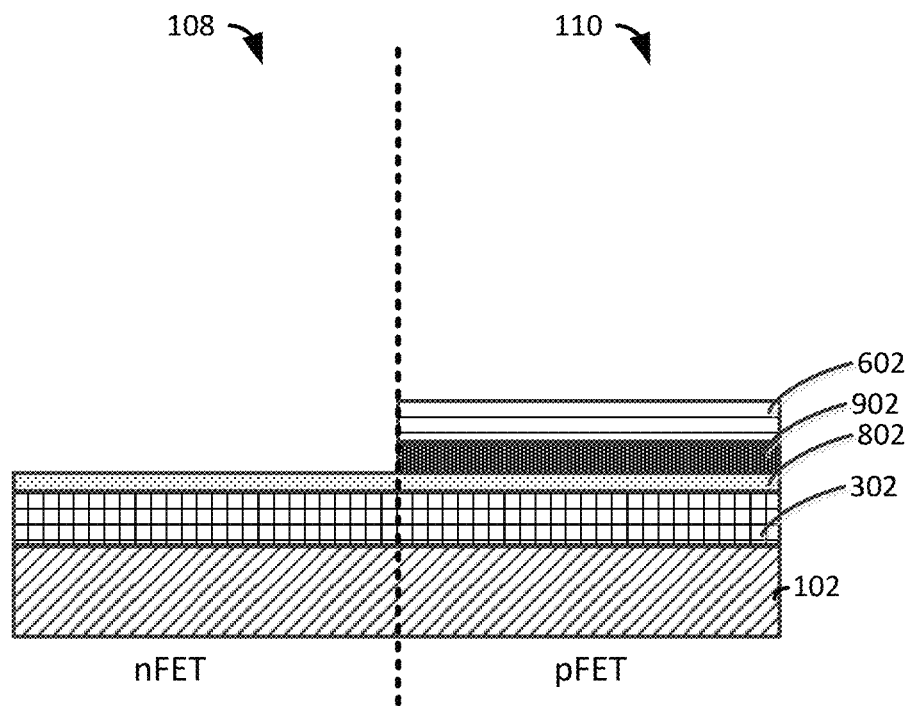

FIG. 22 illustrates the resultant structure following a lithographic patterning and etching process that removes exposed portions of the capping layer 602 and the scavenging layer 902 from the nFET portion 108 of the gate stack. The etching process exposes the nitride layer 802 in the nFET portion 108 of the gate stack.

Figure 23:
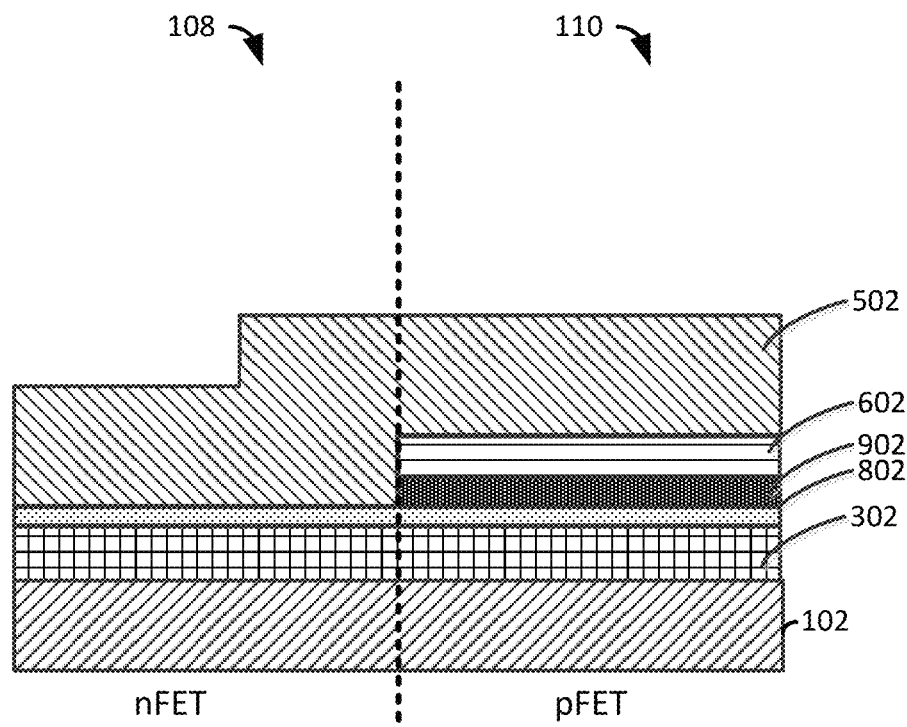

FIG. 23 illustrates the resultant structure following the deposition of a gate metal layer 502 over the nitride layer 802 in the nFET portion 108 and over the capping layer 602 in the pFET portion 110 of the gate stack.

Figure 24:
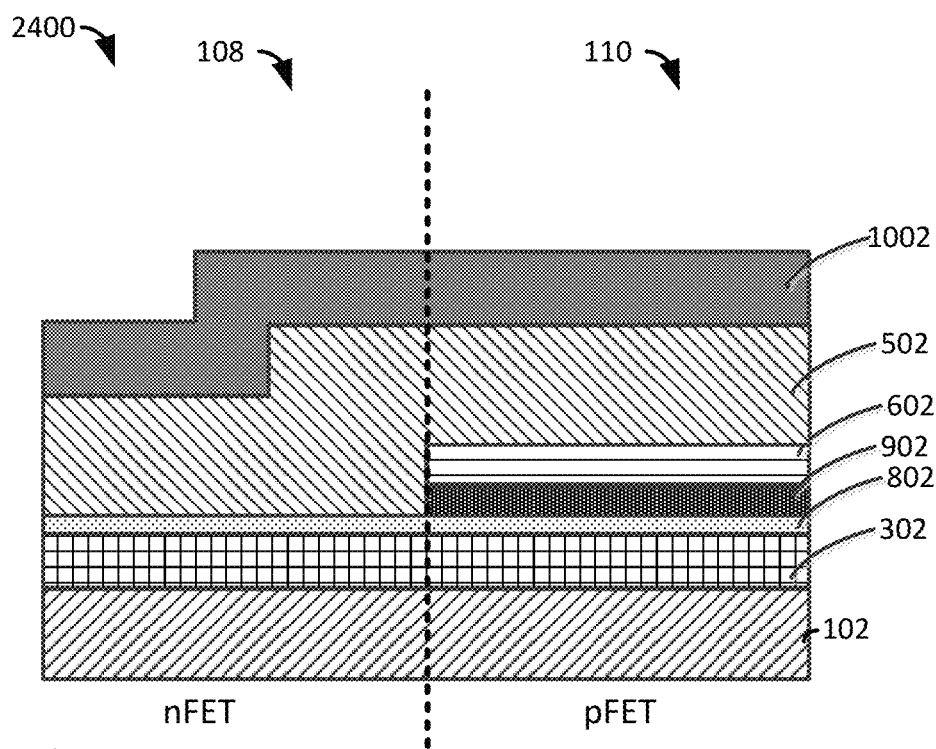

FIG. 24 illustrates the resultant structure following the deposition of a PWF layer 1002 over the gate metal layer 502. Following the deposition of the PWF layer 1002, the gate electrode 1102 is formed over the PWF layer 1002 in a similar manner as described above and planarized using a suitable planarization process, such as, for example, chemical mechanical polishing.

FIG. 24 illustrates another alternate exemplary embodiment of a gate stack 2400 that includes an nFET portion 108 and a pFET portion 110.

Figure 25:
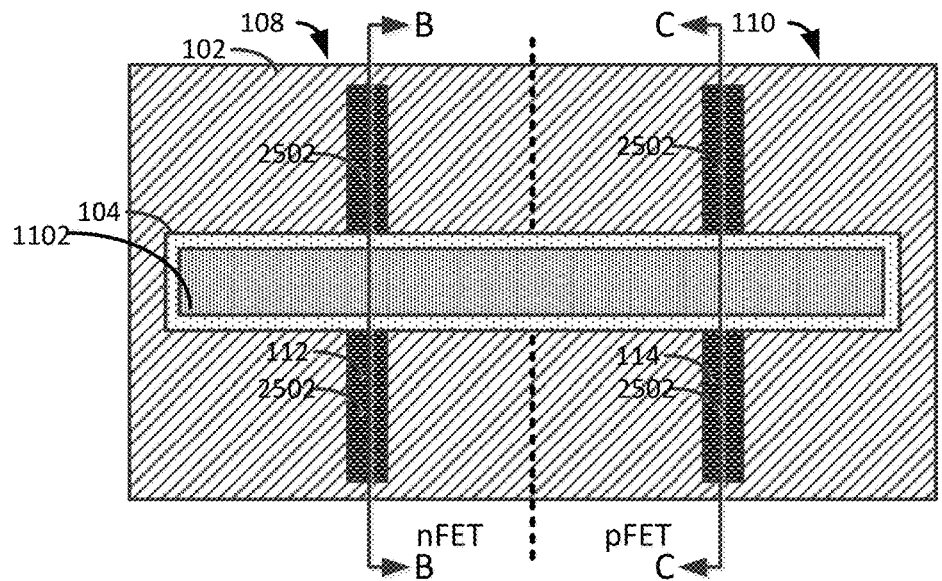
FIG. 25 illustrates a top view of an exemplary embodiment of a finFET device.

FIG. 25 illustrates a top view of an exemplary embodiment of a finFET device. In this regard, the fins 112 and 114 are arranged on the substrate 102. The gate stack 2400 is arranged over channel regions of the fins 112 and 114. The fins 112 and 114 include source/drain regions 2502 that may be formed by, for example, an ion implantation process or an epitaxial growth process. Though the illustrated exemplary embodiment in FIG. 25 includes the gate stack 2400, any of the gate stacks 1100, 1500, or 2000 may be formed as described above over the fins 112 and 114. Alternatively, the gate stacks 1100, 1500, 2000, or 2400 may be formed on a semiconductor substrate to form a planar FET that has source and drain regions that may be partially defined by the semiconductor substrate.

Figure 26:
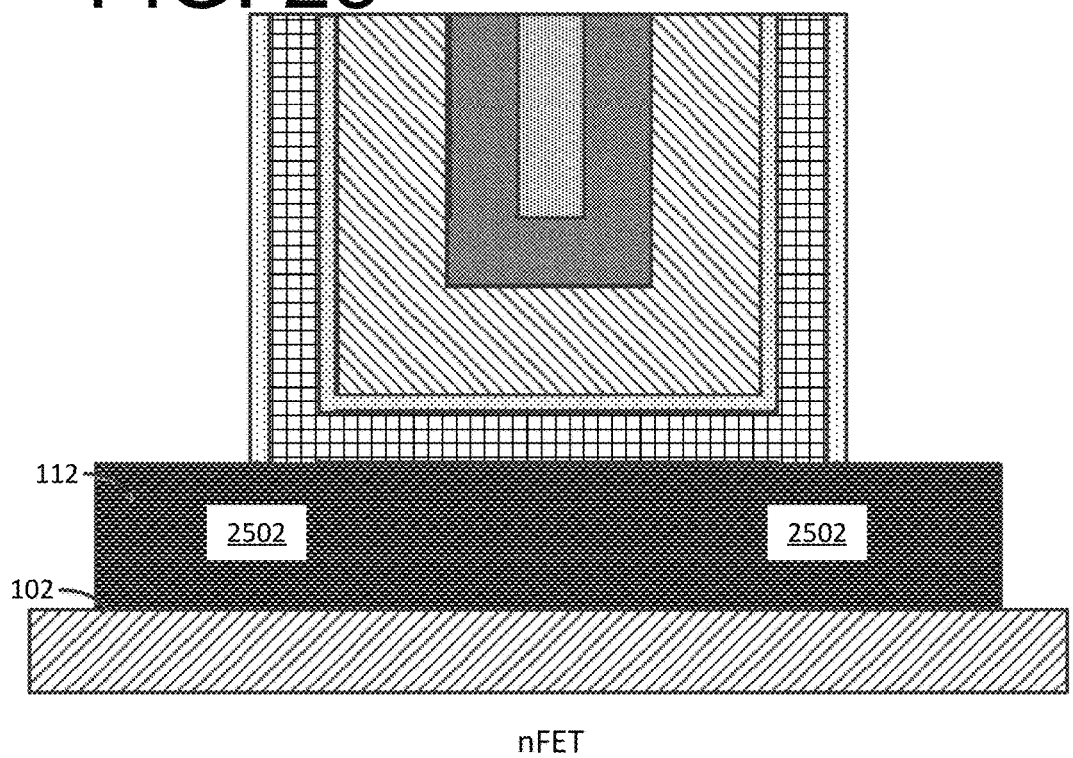
FIG. 26 illustrates a cutaway view along the line B-B of FIG. 25 of the gate stack on the fin.
Figure 27:
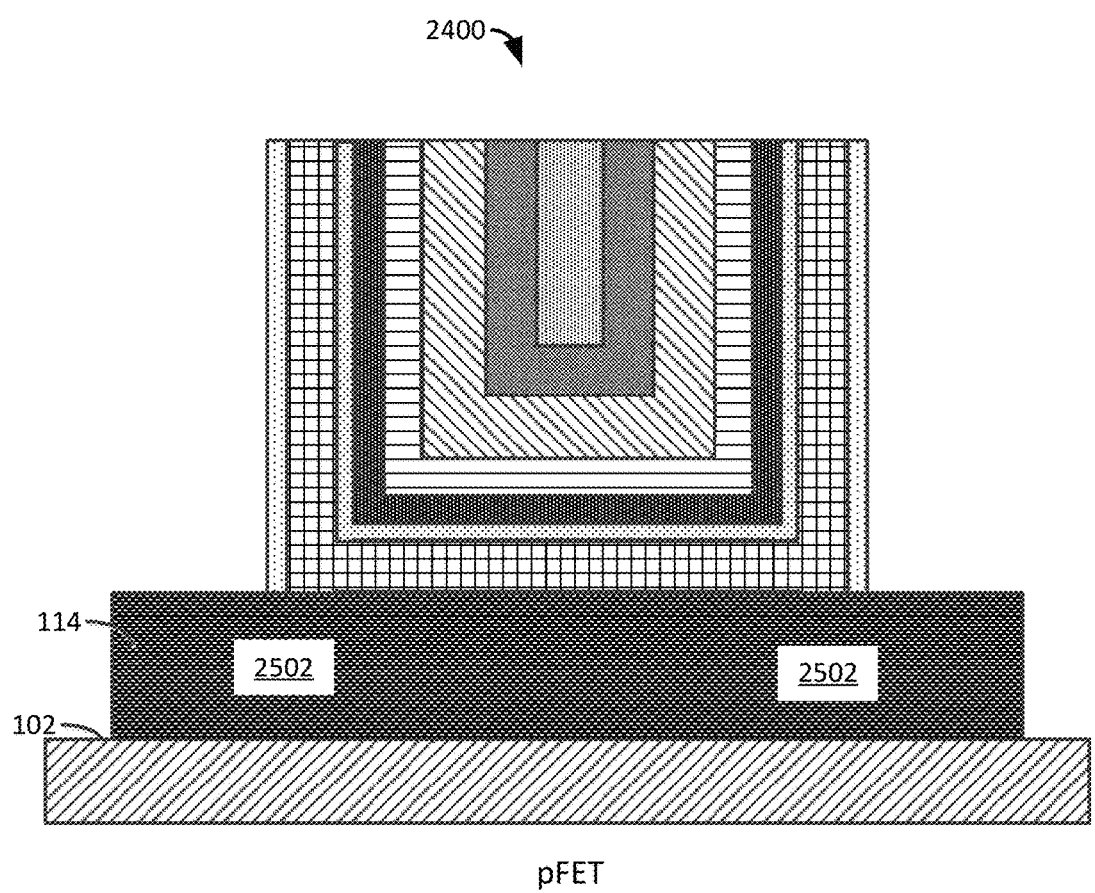
FIG. 27 illustrates a cutaway view along the line C-C of FIG. 25 of the gate stack on the fin.

FIG. 26 illustrates a cutaway view along the line B-B of FIG. 25 of the gate stack 2400 on the fin 112. FIG. 27 illustrates a cutaway view along the line C-C of FIG. 25 of the gate stack 2400 on the fin 114.

Figure 28:
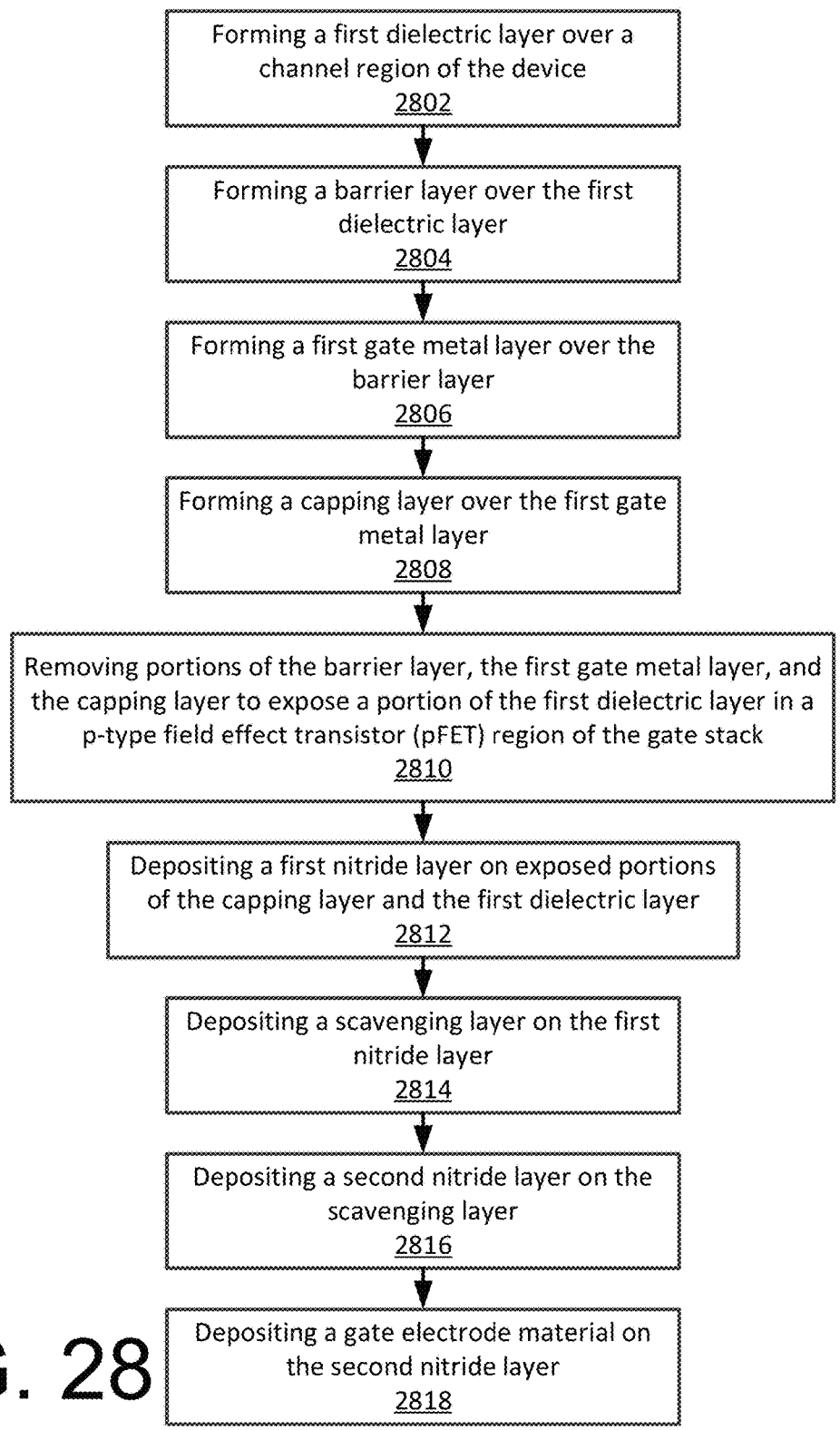
FIG. 28 illustrates a block diagram of an exemplary method for forming a semiconductor device as described above in FIGS. 1-11.

FIG. 28 illustrates a block diagram of an exemplary method for forming a semiconductor device as described above in FIGS. 1-11. Referring to FIG. 28, in block 2802, a first dielectric layer is formed over a channel region of the device. In block 2804, a barrier layer is formed over the first dielectric layer. A first gate metal layer is formed over the barrier layer in block 2806. In block 2808, a capping layer is formed over the first gate metal layer. In block 2810, portions of the barrier layer, the first gate metal layer, and the capping layer are removed to expose a portion of the first dielectric layer in a p-type field effect transistor (pFET) region of the gate stack. A first nitride layer is deposited on exposed portions of the capping layer and the first dielectric layer in block 2812. In block 2814, a scavenging layer is deposited on the first nitride layer. A second nitride layer is deposited on the scavenging layer in block 2816. In block 2818, a gate electrode material is deposited on the second nitride layer.

The methods and embodiments described herein provide for a gate stack with a relatively weak oxygen-scavenge stack to define and adjust the pVt as opposed to a single metal nitride layer such as, for example, TiN and TaN. The weak oxygen-scavenge stack may be formed by deposition or integration, and may include, for example, a barrier layer such as, TiN or TaN and a strong oxygen-scavenge material such as TiAlC or TiAl, Ti, Al, TiAlC, NbAlC.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor device comprising:
   an n-type field effect transistor (nFET) gate stack arranged over a first channel region of the device, the n-type gate stack comprising:
   a dielectric layer arranged on a substrate;
   a first nitride layer arranged on the dielectric layer, the first nitride layer comprising TaN;
   a niobium aluminum carbonitride stack arranged on the first nitride layer:
   a scavenging layer arranged on the niobium aluminum carbonitride stack, the scavenging layer comprising NbAlC or TiAlC;
   a second nitride layer arranged on the scavenging layer, the second nitride layer comprising TiN or TaN; and
   a gate electrode arranged on the second nitride layer; and
   a p-type field effect transistor (pFET) gate stack arranged over a second channel region of the device, the p-type gate stack comprising:
   the dielectric layer arranged on the substrate;
   the first nitride layer arranged on the dielectric layer;
   the scavenging layer arranged on the first nitride layer;
   the second nitride layer arranged on the scavenging layer; and
   the gate electrode arranged on the second nitride layer.

2. The device of claim 1, wherein a thickness of the niobium aluminum carbonitride stack is greater than a combined thickness of the scavenging layer and the first nitride layer in the pFET gate stack.

3. The device of claim 1, wherein the niobium aluminum carbonitride stack comprises:
   a first gate metal layer comprising NbAlC; and
   a capping layer arranged on the first gate metal layer, the capping layer comprising TiN.

4. The device of claim 1, wherein the dielectric layer includes an oxide material.

5. The device of claim 1, wherein the gate electrode comprises W.

6. The device of claim 1 further comprising a source/drain region arranged adjacent to the n-type and p-type gate stacks.

7. The device of claim 1, wherein the channel region of the device is partially defined by a semiconductor fin arranged on the substrate.

\* \* \* \* \*